United States Patent [19]

Wakabayashi et al.

[11] Patent Number: 4,598,307
[45] Date of Patent: Jul. 1, 1986

[54] INTEGRATED CIRCUIT DEVICE HAVING PACKAGE WITH BYPASS CAPACITOR

[75] Inventors: Tetsushi Wakabayashi, Yokohama; Kiyoshi Muratake, Kawasaki, both of Japan

[73] Assignee: Fujitsu Limited, Kawasaki, Japan

[21] Appl. No.: 530,046

[22] Filed: Sep. 7, 1983

[30] Foreign Application Priority Data

Sep. 22, 1982 [JP] Japan .................. 57-165432

[51] Int. Cl.[4] ................ H01L 23/16; H01L 23/48
[52] U.S. Cl. ........................ 357/75; 357/70; 357/80; 174/52 FP
[58] Field of Search ............... 357/68, 70, 74, 75, 357/80; 174/52 FP; 361/401, 404, 400, 403

[56] References Cited

U.S. PATENT DOCUMENTS

| | | | |
|---|---|---|---|
| 4,137,546 | 1/1979 | Frusco | 357/80 |
| 4,249,196 | 2/1981 | Durney et al. | 357/80 |
| 4,303,934 | 12/1981 | Stitt | 357/80 |
| 4,413,404 | 11/1983 | Burns | 357/70 |
| 4,451,845 | 5/1984 | Philofsky et al. | 357/80 |
| 4,453,176 | 6/1984 | Chance et al. | 357/70 |
| 4,454,529 | 6/1984 | Philofsky et al. | 357/80 |
| 4,527,185 | 7/1985 | Philofsky et al. | 357/80 |
| 4,539,622 | 9/1985 | Akasaki | 361/401 |

FOREIGN PATENT DOCUMENTS

| | | |
|---|---|---|
| 2047458 | 4/1971 | Fed. Rep. of Germany . |
| 57-118661 | 7/1982 | Japan . |
| 2057757 | 4/1981 | United Kingdom . |
| 2091035 | 7/1982 | United Kingdom . |

Primary Examiner—James W. Davie
Assistant Examiner—Frank Gonzalez
Attorney, Agent, or Firm—Staas & Halsey

[57] ABSTRACT

In order to protect ICs from noise it is necessary to mount a bypass capacitor as close as possible to the IC die or chip. The package must seal the die from the environment, but there are marginal spaces at the ends of a dual in line type package (DIP type package) which are not needed for the sealing function. An opening is made in the lid of the package at such a marginal area, and a chip capacitor is mounted in the opening. An additional post is provided on the lead frame. A portion of this additional post and a portion of another lead provided by the frame are exposed through the opening in the lid. The chip capacitor is soldered to the exposed portions to mechanically and electrically connect the capacitor. The additional post is scored at the edge of the package to permit easy removal of the portion thereof that would otherwise extend outside the package.

13 Claims, 5 Drawing Figures

INTEGRATED CIRCUIT DEVICE HAVING PACKAGE WITH BYPASS CAPACITOR

BACKGROUND OF THE INVENTION

The present invention relates to an integrated circuit, and more particularly to an integrated circuit which is protected from noise by a chip capacitor mounted on its package.

As the packing density of the elements of integrated circuit devices (ICs) increases, it is becoming increasingly important to protect the ICs from noise in order to secure reliable operation. Because circuit design becomes more critical with higher degrees of integration, and the margins between the lower or higher level of digital signals and the threshold levels are reduced, highly integrated circuitry is subject to malfunction due to noise. In order to reduce this problem a bypass capacitor can be connected between the power source and the ground.

Usually such a capacitor is mounted on the printed circuit board and the leads of the capacitor are connected to the power supply line and the ground line respectively. The capacitor protects the IC from noise induced on the power supply line. As integration density and speed increase, however, it becomes impossible to ignore the distributed inductance between the capacitor and the IC. It is often reported that the pulses generated by the IC itself have been induced on the power source line, and that this noise is not smoothed out by the bypass capacitor but is instead superposed on the source voltage, thus causing malfunctions.

Recently a couple of approaches have been tried in order to overcome this problem. One of these approaches was to mount a capacitor on the top of an IC package and to wire the capacitor's leads to the ground and power source pins of the IC. However this approach did not reduce the wire length enough to effectively eliminate the inductance, and so the operation of the IC remained insufficient.

Another approach to a solution was to mount a capacitor in the IC package. A chip capacitor was placed on the die or chip bonding area of the package and the IC die or chip was mounted on the chip capacitor. This arrangement resulted in other problems. A very clean environment is needed for the IC die, and placing the capacitor in the same chamber with the IC die tended to contaminate the environment. Heat problems were also troublesome, since the heat generated by the IC should be released from the package, but the thermal resistance was increased by stacking the IC die on the chip capacitor. Another problem was that the package needed to be redesigned since the chamber for the IC die needed to be higher in order to also accommodate the chip capacitor. This increases the cost of the package.

SUMMARY OF THE INVENTION

It is, accordingly, an object of the present invention to provide a semiconductor device which is protected from noise and which has a stable operation.

Another object of the present invention is to provide a chip capacitor for protection against noise and for stabilizing operation while only slightly changing the standard IC package, thus not increasing the package cost, and avoiding the environmental and thermal problems.

Another object of the present invention is to provide a chip capacitor for an IC which employs a conventional IC die and which is fabricated by a conventional IC production process, without any change or redesign of the die or the production process.

Still another object of the present invention is to provide an IC lead structure suitable for realizing the above mentioned objects.

The foregoing objects are accomplished by making a cut or hole in the lid of the IC package, thus exposing portions of the leads, and soldering a chip capacitor to the exposed leads.

The present invention is characterized in that the chip capacitor is mounted as part of the package in a marginal region where the package is used only for the connection between the pins and IC die; that is, where the package is not employed for the sealing of the die. A cut or hole is made in this marginal portion of the package lid to expose a portion of the leads. The chip capacitor is inserted in this opening and soldered between a terminal for the power source lead and a terminal for the ground lead or an additional post specially provided for this purpose. A practical way to provide the additional post is also disclosed.

BRIEF DESCRIPTION OF THE DRAWINGS

The invention will now be described with reference to the accompanying drawings, wherein.

In the drawings, like reference numerals are used to designate like or corresponding parts throughout the several FIGURES.

DESCRIPTION OF THE PREFERRED EMBODIMENTS

As previously noted, in order to protect high speed and highly integrated ICs from noise, it is important to mount a capacitor to bypass noise as close as possible to the IC die or chip. On the other hand the IC die requires an extremely clean environment, so it should not be mounted in the same place as the capacitor. Furthermore the die must be sealed tightly.

From the viewpoint of sealing, especially for a dual in line package (it is usually called a DIP-type package), the sealing margin on both sides along the longitudinal direction of the package is large compared to the sealing margin along the lateral direction. Accordingly, an opening can be provided in the package lid adjacent an end of the package without any harm to the sealing effect. It should also be noted that, as integration becomes large and the IC die needs many connections to the printed circuit board on which it is to be mounted, the number of pins increases. As the number of pins increases (as is generally required for higher integration) the length of the package also increases, thereby ensuring a surplus package margin which might be cut off in highly integrated circuits.

Dual in line packages are frequently designated DIP-10, DIP-16, DIP-20, and so on, according to the number of pins. The present invention especially relates to glass sealed, ceramic-type DIP packages, which are sometimes known as "cerdip" type packages. Although the present invention is described hereafter with respect to a semiconductor device sealed in a DIP type package, the spirit of the present invention can be applied to any type of package which sandwiches the leads between a lead base and a lid made of ceramic, such as a "flat pack" type of package for example.

In the present invention the above mentioned marginal space at the margin of the package is used to mount a chip capacitor. An opening such as a cut or hole is made on the lid of the package at a place corresponding to said marginal space, thereby exposing a portion of the leads, and a chip capacitor is soldered directly to predetermined leads exposed through the cut.

Figure 1:
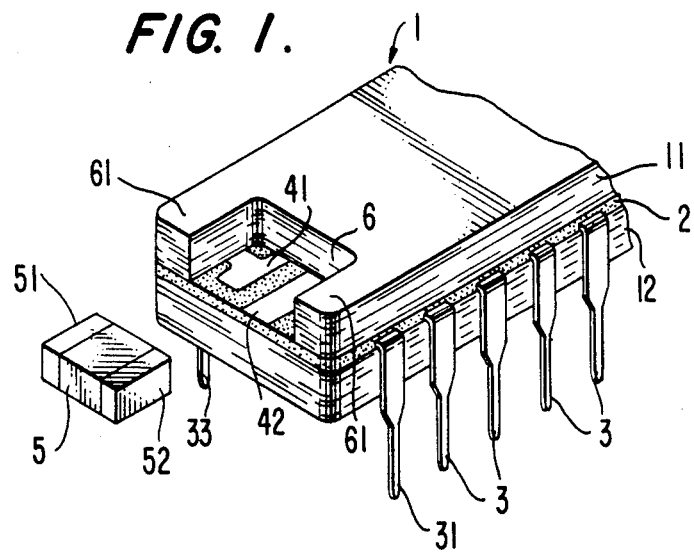
FIG. 1 is a perspective view of one preferred embodiment of this invention, in which the chip capacitor is mounted on a rectangular cut on the lid of the package.

FIG. 1 is a perspective view illustrating one embodiment of the present invention. In the figure, reference number 1 represents a DIP type ceramic IC package (as noted above sometimes deemed a cerdip type package), 11 is the lid, and 12 is the lead base bonded to lid 11 by glass layer 2. The leads are sandwiched between the lid 11 and the lead base 12. The pins 3 are provided for connecting a printed circuit board (not shown) to an IC die within package 1. The figure shows, as an example, a sixteen dual in line type package, which is usually called a DIP-16 type package, and the explanation will be carried on hereafter with respect to the DIP-16 type package. This is only for the sake of convenience, however, and it should be understood that the spirit of the present invention is not limited to DIP-16 type packages but can be applied to packages having different numbers of pins.

Referring again to FIG. 1, a rectangular cut 6 is provided at the end of the lid 11. This can easily be accomplished during the usual fabrication process for the lid 11 by forming a cut in the lid before it is baked or sintered in an oven. This rectangular cut is located in the marginal space as explained previously, so as not to interfere with the sealing of the IC die. The cut 6 exposes portions of the leads which are sandwiched between the lid 11 and the lead base 12. The exposed leads correspond to spokes of a lead frame which will be explained hereafter with reference to FIGS. 3, 4 and 5. The exposed leads are shown in FIG. 1 as 41 and 42. The exposed parts 41 and 42 are not truly spoke-shaped, as can be seen on the left hand side of the lead frame shown in FIG. 3, since they are configured to permit the chip capacitor 5 to be soldered to them.

With continuing reference to FIG. 1, the chip capacitor 5, having terminals 51 and 52, is preferably small in size and has a capacitance as large as possible. The fabrication of such capacitors, which can be made, for example, from barium titanate, is known in the art. Among the many types of available chip capacitors, one example suitable for use in the present invention has a capacitance ranging from 0.1 to 5 micro-farads, and a size of 2 mm long, 1 mm wide, and 0.5 mm high.

Accordingly, the rectangular cut 6 in FIG. 1 may be very small. For example a rectangular cut which is 3 mm wide and 3 mm long is large enough for mounting a chip capacitor. One can easily get a feeling of the size by comparing the width of the lid 11 (approximately 7 mm) of the DIP type package shown in FIG. 1. Since a sealing width of 1.5 or 2 mm is enough for sealing the IC die, it will be apparent that a small rectangular cut for accommodating the chip capacitor still leaves enough package space for properly sealing the IC die.

In lieu of the rectangular cut 6 in FIG. 1, space for the chip capacitor may be provided by merely cutting down the lid length. However in practice it is better to leave both side walls 61 as shown in FIG. 1. The reason for this is that ICs are usually mounted on printed circuit boards by automatic machines, and the lead pins have to stand fairly large forces when they are inserted into the holes on the printed circuit board. According to the experience of the inventors, packages without side walls often suffered loose pins. On the other hand packages which retained the walls 61, as shown in FIG. 1, were strong enough to withstand loose pin trouble.

Figure 2:
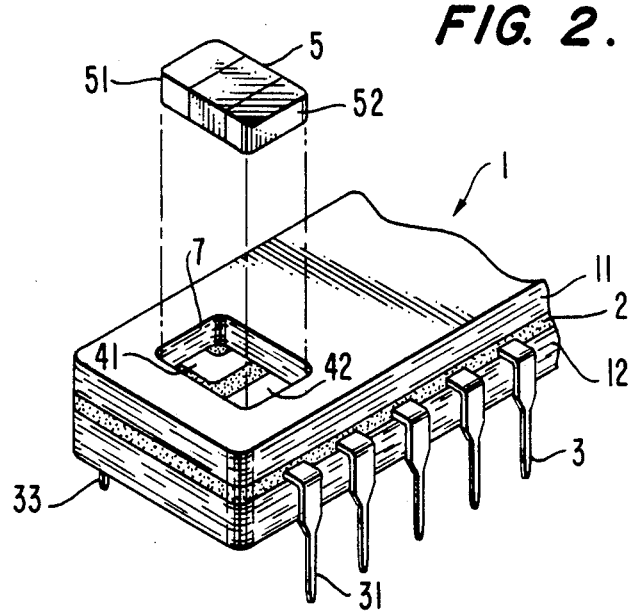
FIG. 2 is a perspective view of another preferred embodiment of this invention, in which the chip capacitor is mounted in the rectangular hole made on the lid of the package.

FIG. 2 illustrates another embodiment of the present invention, with like reference characters designating corresponding parts. In contrast to the cut 6 in FIG. 1, the lid 11 of the package 1 in FIG. 2 is provided with a hole 7. The hole 7 is located on the marginal space, like the cut 6 in FIG. 1. The size of the rectangular hole 7 is comparable to that of the rectangular cut 6 in FIG. 1. For example, the hole 7 may be 3 mm long and 3 mm wide.

With continuing reference to FIG. 2, portions of leads are exposed through the hole 7 as at 41 and 42. A chip capacitor 5 is inserted into this hole and terminals 51 and 52 are soldered to the exposed leads. The function and the effect of the parts are the same as in FIG. 1. As was mentioned above with regard to the cut 6 in FIG. 1, the hole 7 of FIG. 2 can be preformed precisely before the lid is baked and sintered in an oven as part of the conventional manufacturing process for the lids.

Figure 3:
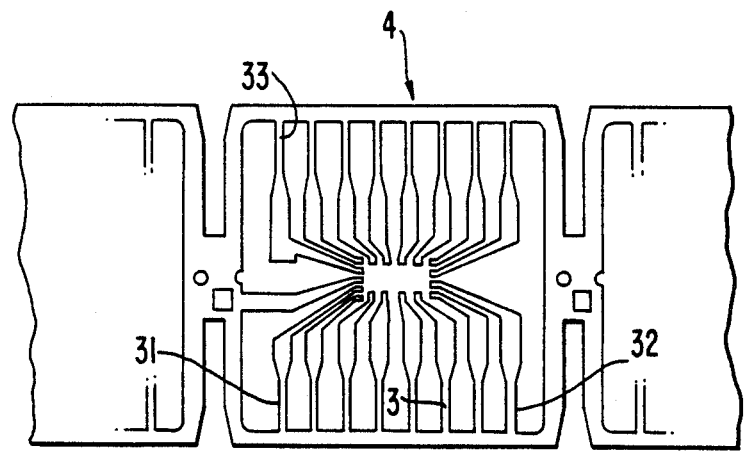
FIG. 3 is a plan view of one section of a lead frame, suitable for use with an embodiment of the present invention, made from a metal sheet by punching or etching.

FIG. 3 shows a metal lead frame 4 which can be used during fabrication of the present invention. Usually such lead frames are made in a long queue, each lead frame repeating the same pattern. FIG. 3 shows the details of only one lead frame in such a queue. The longitudinal direction of the lead frame corresponds to that of the package when it is glazed to it. Usually the lead frame pattern for conventional ICs is made symmetrically with respect to the center line. In FIG. 3, however, it will be noted that the left side of the pattern is not entirely symmetrical, for reasons which will be explained hereafter.

As can be seen from FIG. 3, on both sides in the longitudinal direction, and especially on the right hand side, the pattern resembles spokes to connect the pins 3 and the IC die. Such a lead frame can be formed from a metal ribbon by the conventional techniques of punching or etching, and a conventional spoke pattern can be easily modified for use in the present invention, as by merely altering the model of the punch or the etching pattern. In the present embodiment the left side of the pattern is modified as can be seen in the FIG. 3.

The pins of an IC package are usually assigned numbers to distinguish them from each other. Usually a pin close to a specific mark on the package lid is deemed pin number 1. In the present invention the rectangular cut 6 or the rectangular hole 7 can serve as the mark on the lid. In the FIGURES, let reference number 31 identify pin number 1, and let the remaining pins be numbered in the counterclockwise direction. Assuming again that the package is a DIP-16 type package, as an example, reference number 32 would be pin number 8 and reference number 33 would be pin number 16.

In many DIP-16 ICs the power source is connected to pin number 16 and pin number 8 is grounded. That is, the source and the ground pins are usually located at diagonal positions on the package. Occasionally pins number 1 and 9 are used as the source and the ground. In such a case the rectangular cut 6 or the rectangular hole 7 shown in FIGS. 1 and 2 should be made on the reverse side of the drawings. It will be apparent, however, that in such cases the lid and the lead frame can be used merely reversing their directions or facing them upside down. As mentioned above the chip capacitor should be mounted as close as possible to the IC die and its power source pin.

Figure 4:
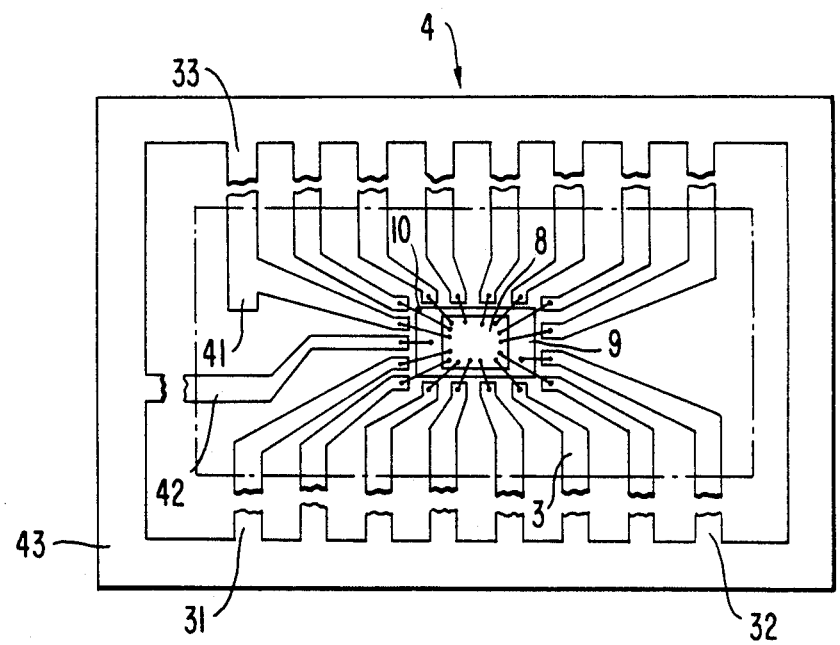
FIG. 4 shows the central part of FIG. 3, enlarged to illustrate details of the lead frame.

FIG. 4 shows part of the lead frame pattern 4 of FIG. 3, with its central part enlarged to facilitate explanation. In FIG. 4 an additional post 42 is added to the lead frame 4. The spoke to connect pin number 16 (reference number 33) to IC die 8, which is mounted on metalized base 9, has a bulge 41. The spoke for pin number 1 (reference number 31) is moved slightly from its conventional position to provide the space for the additional post 42. It will be apparent that the chip capacitor can be mounted on parts 41 and 42.

The IC die 8 may be any type, for example a memory circuit, and is mounted on the metalized base 9 by eutectic bonding or glazing, according to whether it is necessary to ground or insulate the back surface of the die from the base 9. The IC die 8 is connected to the leads by gold or aluminum wire 10 by a conventional wire bonding technique. The ground lead 32 is connected to the base 9, which is connected to the additional post 42 by wire bonding. To facilitate this bonding, the additional post 42 is extended toward the base. It will be apparent that the chip capacitor 5 to bypass the noise is mounted between source and the ground at the closest point to the IC die, thus fulfilling a main object of the invention.

Next another important aspect of the invention will be explained with reference to FIG. 4 which, as mentioned above, shows the central part of the lead frame 4 of FIG. 3 enlarged in order to illustrate the details. In FIG. 4 the chained line shows the edge of the lid and the lead base when they are glazed together, sandwiching the leads 3 between them. The additional post 42 should have no outer pin since the standard DIP type case allows no additional pin. Accordingly the post 42 must be cut off from the outer frame 43 after the post has been sandwiched between the lid and the lead base. It is desirable for the additional post to have no tail projecting outside the package because such a tail might scratch something else or otherwise cause damage or package defects.

It would be difficult to cut the frame without leaving an outer tail from post 42. To avoid this problem the additional post 42 in FIG. 4 has a half-cut groove at the edge of the package (at the place where the chained line crosses the post 42). After the lead frame is glazed to the lead base and the lid, it is easy to break off the outer frame without leaving a tail merely by bending at the half-cut groove. This process is accomplished automatically in the process of bending the outer pins 3.

Figure 5:
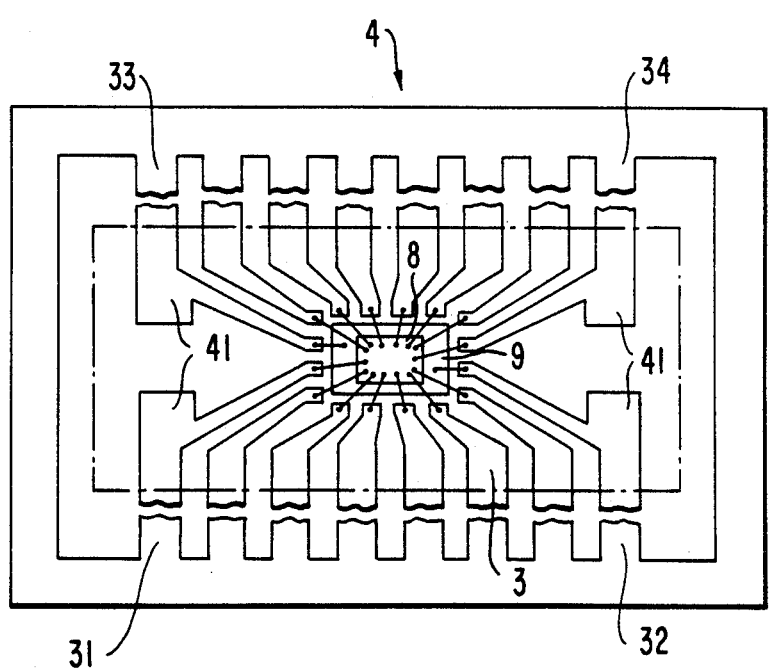
FIG. 5 corresponds to FIG. 4 and illustrates the central part of a lead frame suitable for use with another embodiment of this invention.

In the foregoing description, the invention was applied to semiconductor devices which are already in production and wide use, to improve their operation in noisy environments. The ICs were conventional; that is, the arrangements of bonding areas to be wire-bonded to corresponding leads has already been fixed, and the arrangements of pins for connection to printed circuit boards have also been fixed. If these restrictions did not exist, there would be greater flexibility, and the bonding areas of the IC dies or the package pin connections could be advantageously rearranged. An example of a lead frame for use in such cases is shown in FIG. 5. The Figure shows the central part of another type of lead frame which corresponds to FIG. 4. As can be seen in FIG. 5, the lead frame 4 is symmetric on both the left and right sides. The bulges 41 to which the chip capacitor is soldered are made on each lead 31, 32, 33 and 34 (each correspond to pin numbers 1, 8, 16 and 9 of a DIP-16 type package). In this case the additional post 42 of FIG. 4 is unnecessary. The chip capacitor may be connected to either side as required by the circuit design. If pin number 1 is chosen as a source pin, pin number 16 should be grounded and vice versa. Pins number 8 and 9 can be used in the same way. Of course a symmetrical lead frame is not strictly necessary, and the bulges 41 may be made on one side only of the lead frame, but the example shown in FIG. 5 offers considerable design flexibility because it can be applied to a wide variety of circuit designs and applications.

Next a more detailed explanation of how the chip capacitor is soldered will be provided. Before soldering, the IC die is mounted and wire bonded just as in the conventional IC manufacturing process. The lid, having a rectangular cut or rectangular hole, is glazed to the lead base and the lead frame to seal off the IC die. These processes require no modification from the conventional process of IC manufacturing.

The surface of the leads exposed through the lid are oxidized to some extent in the above-mentioned process. Accordingly, it is desirable to remove the oxide layer on the surfaces of part 41 and 42 in FIGS. 1 and 2 by etching, for example, and to coat them with solder after cleaning. The terminals 51 and 52 of the chip capacitor 5 shown in FIGS. 1 and 2 are also coated with solder. The chip capacitor 5 is then positioned in the lid opening with its terminals 51 and 52 adjacent the elements 41 and 42 respectively and the assembly is heated in an oven. The melting point of solder is much lower than the temperature for die bonding, wire bonding, or glazing, so the soldering process does not harm the IC circuit. Furthermore, since the IC die is sealed off as previously mentioned, flux or other contaminants resulting from the soldering process can be washed out, after the process is finished.

It should be understood that the openings in the package lid for the capacitor need not necessarily be rectangular. For example, a U-cut may be good for purposes of the present invention, although a rectangular shape is the most natural and preferable one. Nor need the opening for the capacitor necessarily be provided on the top or lid portion of the package. Regardless of which side of the package the opening is provided on, the opening can be shaped to receive a suitably configured capacitor in one direction only.

The embodiments of FIG. 1 (the rectangular cut type) and FIG. 2 (the rectangular hole type) each have their own advantages. According to the experience of the inventors, the former was preferable to the latter to some extent with regard to the washing process. On the other hand the latter embodiment has an appearance more closely resembling the conventional DIP type package.

It will be apparent from the foregoing disclosure that the present invention requires no substantial change in the conventional IC manufacturing process. It can be applied to any mass production system, or to any type of IC to improve its stability in a noisy environment without redesign of the IC die. Although the discussion has been presented with respect to a DIP-16 type package, the invention can be applied to any type of dual in line type ceramic packaged electron device or to any semiconductor devices which are sealed in a ceramic package whose leads are sandwiched between its lid and lead base.

What we claim is:

1. An integrated circuit device, comprising:
   an integrated circuit die;
   a lead base made of ceramic for mounting said integrated circuit die;
   a lid made of ceramic, and having an opening in a marginal region thereof, said lid being bonded to said lead base such that said die is sealed between said lead base and said lid in a region other than said marginal region;
   a plurality of metal leads sandwiched between said lead base and said lid, a pair of said leads having portions thereof that are exposed to said opening in the lid; and
   a chip capacitor positioned within said opening in the lid having terminals that are soldered to said portions of said leads that are exposed to said opening.

2. An integrated circuit device according to claim 1, wherein said lid is elongated and said opening is located at one end of said lid.

3. An integrated circuit device according to claim 2, wherein one of said metal leads comprises a power source pin and wherein said opening is located at the end of the lid closest to said power source pin.

4. An integrated device according to claim 1, wherein said leads comprise an additional post, said additional post having a portion thereof exposed to said opening and soldered to a terminal of said capacitor, said additional post terminating at the periphery of said lead base.

5. An integrated circuit device according to claim 4, wherein said lid is elongated and wherein said opening is a rectangular cut located at one end of the lid and forming part of the periphery of said lid.

6. An integrated circuit device according to claim 4 wherein said lid is elongated and wherein said opening is a rectangular hole located adjacent one end of said lid at a position spaced apart from the periphery thereof.

7. An integrated circuit device according to claim 5, wherein said additional post is formed on a lead frame and has a half-cut groove at a position where said additional post crosses the periphery of said lead base.

8. An integrated circuit device according to claim 6, wherein said additional post is formed on a lead frame and has a half-cut groove at a position where said additional post crosses the periphery of said lead base.

9. An integrated circuit device, comprising:
   an integrated circuit die;
   first and second elongated package elements joined together with their axes parallel and sealing the die between them, one of said package elements having an opening therein;
   a plurality of metal leads sandwiched between said package elements and electrically connected to said die, a pair of said leads having portions thereof that are exposed to said opening; and
   a chip capacitor positioned within said opening and having terminals electrically connected to the portions of said pair of leads that are exposed to said opening.

10. The device of claim 9, wherein one of said pair of leads is electrically connected to a power input port on said die and the other of said pair of leads is electrically connected to a ground input port on said die.

11. The device of claim 10, wherein said opening is disposed in one of said package elements and one of said pair of leads has at least a portion thereof disposed substantially parallel to an edge of one of said package elements.

12. The device of claim 11, wherein said opening is a rectangular opening positioned adjacent an end of one of said package elements but spaced apart from the periphery thereof.

13. The device of claim 11, wherein said opening is a rectangular opening positioned at an end of one of said package elements, one side of the rectangular opening coinciding with said end.

* * * * *